United States Patent
Yang et al.

(10) Patent No.: US 12,490,398 B2
(45) Date of Patent: Dec. 2, 2025

(54) ELECTRONIC DEVICE HOUSING AND ELECTRONIC DEVICE

(71) Applicant: GOERTEK INC., Shandong (CN)

(72) Inventors: Shuo Yang, Shandong (CN); Zhiyuan Du, Shandong (CN); Bo Mi, Shandong (CN)

(73) Assignee: GOERTEK INC., Weifang (CN)

( * ) Notice: Subject to any disclaimer, the term of this patent is extended or adjusted under 35 U.S.C. 154(b) by 84 days.

(21) Appl. No.: 18/578,886

(22) PCT Filed: Sep. 6, 2022

(86) PCT No.: PCT/CN2022/117139
§ 371 (c)(1),
(2) Date: Jan. 12, 2024

(87) PCT Pub. No.: WO2023/045746
PCT Pub. Date: Mar. 30, 2023

(65) Prior Publication Data
US 2024/0414866 A1    Dec. 12, 2024

(30) Foreign Application Priority Data
Sep. 27, 2021   (CN) .......................... 202111137900.7

(51) Int. Cl.
*H05K 5/06* (2006.01)
*H05K 5/10* (2025.01)
(52) U.S. Cl.
CPC ................. *H05K 5/06* (2013.01); *H05K 5/10* (2025.01)
(58) Field of Classification Search
None
See application file for complete search history.

(56) References Cited

U.S. PATENT DOCUMENTS

| 2010/0032039 | A1 | 2/2010 | Nemoto et al. |
| 2017/0180850 | A1 | 6/2017 | Hsu et al. |
| 2019/0072903 | A1* | 3/2019 | Park ....................... G04G 13/00 |

FOREIGN PATENT DOCUMENTS

| CN | 106931203 A | 7/2017 |
| CN | 206559809 U | 10/2017 |

(Continued)

OTHER PUBLICATIONS

International Search Report from International Application No. PCT/CN2022/117139 mailed Nov. 23, 2022.

*Primary Examiner* — Xanthia C Relford
(74) *Attorney, Agent, or Firm* — Shih IP Law Group, PLLC

(57) ABSTRACT

Disclosed are an electronic device housing including a casing and a seal, and an electronic device. The casing has an interior provided with an accommodating cavity configured to accommodate electronic device components, and a casing wall provided with a mounting cavity configured to mount the seal. The casing includes first and second through holes. The first and second through holes communicates the mounting cavity with the accommodating cavity and an outside, respectively. The seal includes a sealing part and a fixing part connected thereto. The fixing part is fixed to the casing wall, and the sealing part blocks the first through hole. The sealing part has elasticity. When pressure in the accommodating cavity is greater than that of the outside, at least part of the sealing part is separated from the first through hole, such that the accommodating cavity communicates with the mounting cavity to communicate with the outside.

10 Claims, 4 Drawing Sheets

(56) References Cited

FOREIGN PATENT DOCUMENTS

| | | |
|---|---|---|
| CN | 209314160 U | 8/2019 |
| CN | 110650608 A | 1/2020 |
| CN | 210093726 U | 2/2020 |
| CN | 113784563 A | 12/2021 |
| JP | 2015108445 A | 6/2015 |

* cited by examiner

ELECTRONIC DEVICE HOUSING AND ELECTRONIC DEVICE

CROSS REFERENCE TO RELATED APPLICATION

This application claims a priority to the application Ser. No. 202111137900.7, entitled "electronic device housing and electronic device", filed with Chinese Patent Office on Sep. 27, 2021, which is hereby incorporated by reference as if fully set forth herein.

TECHNICAL FIELD

The present disclosure relates to a technical field of electronic device structure, and more particularly, to an electronic device housing and an electronic device.

BACKGROUND

With the development of technology, the functions of the electronic devices are becoming increasingly powerful, and scenarios, such as swimming, mountain climbing, skiing, etc., in which consumers use electronic devices, are becoming increasingly complex. In relatively extreme environments, electronic devices often have the problem of waterproof failure, which may easily make the electronic device unavailable.

Although the waterproof structure of related electronic devices may prevent liquids from entering the interior of the electronic device to some extent, it does not have the function of achieving pressure balance between inside and outside of the electronic device due to structural reasons. That is, when the electronic device enters a low-pressure environment from a high-pressure environment, the internal pressure of the electronic device is greater than the external pressure, and therefore, the internal pressure of the electronic device cannot be released, resulting in a certain safety risk in the use of the electronic device.

SUMMARY

In order to solve the above problems, the present disclosure discloses an electronic device housing and electronic device to overcome the above problems or at least partially solve the above problems.

In order to achieve the above purposes, the present disclosure adopts the following technical solutions.

On the one hand, the present disclosure discloses an electronic device housing, including a casing and a seal, wherein the casing has an interior provided with an accommodating cavity configured to accommodate electronic device components, and a casing wall provided with a mounting cavity configured to mount the seal;

wherein the casing is provided with a first through hole and a second through hole, wherein the first through hole communicates the mounting cavity with the accommodating cavity, and the second through hole communicates the mounting cavity with an outside; and wherein the seal comprises a sealing part and a fixing part connected with the sealing part, wherein the fixing part is fixed to the casing wall, and the sealing part blocks the first through hole, and wherein the sealing part has elasticity, and when pressure in the accommodating cavity is greater than that of the outside, at least part of the sealing part is separated from the first through hole, such that the accommodating cavity communicates with the mounting cavity to communicate with the outside.

Furthermore, a surface of the sealing part facing the first through hole may have an arc-shaped portion that is concave towards a direction away from the first through hole.

Furthermore, the casing may be provided with an arc-shaped protrusion that corresponds to a shape of the arc-shaped portion, and the first through hole may be provided on the arc-shaped protrusion.

Furthermore, the fixing part may abut at least partially against two inner walls of the mounting cavity that are not located on the same plane.

Furthermore, the seal may be made of hydrophobic material or coated with a hydrophobic layer on a surface thereof.

Furthermore, the casing may include a front casing and a rear casing; and the rear casing may be provided with an opening, and the front casing may mounted on the opening, with the seal interposed between the front casing and the rear casing.

Furthermore, the fixing part of the seal may be configured to seal a connection between the front casing and the rear casing.

Furthermore, a flange may be provided on a circumferential edge of an inner surface of the front casing, and the mounting cavity may be formed between the circumferential edge of the front casing, the flange, and an inner wall of the rear casing; and the first through hole may be provided on the flange, and the second through hole may be provided on a circumferential edge of the front casing.

Furthermore, a compression force may be imposed between the sealing part and the flange and between the fixing part and the inner wall of the rear casing when the seal is mounted between the rear casing and the front casing.

On the other hand, the present disclosure discloses an electronic device, wherein the electronic device has the electronic device housing as described above and components accommodated inside the casing.

The advantages and beneficial effects of the present disclosure are as follows.

In the electronic device housing of the present disclosure, a mounting cavity for mounting the seal is provided on the casing wall of the casing, and a first through hole and a second through hole are provided on the casing, such that the accommodating cavity inside the casing communicates with the mounting cavity through the first through hole, and the mounting cavity inside the casing communicates with the outside through the second through hole, and the sealing part of the seal blocks the first through hole, thereby effectively preventing external liquid from entering the accommodating cavity; and when the air pressure is different between the accommodating cavity and the outside, gas exchange between the accommodating cavity and the outside is achieved through the first through hole and the second through hole, thereby achieving air pressure balance.

BRIEF DESCRIPTION OF DRAWINGS

In order to more clearly illustrate the embodiments of the present disclosure or the technical solutions in the prior art, the drawings required to be used for the content of the embodiments or the prior art will be briefly introduced in the following. Obviously, the drawings in the following description are merely some embodiments of the present disclosure, and for those of ordinary skill in the art, other drawings can also be obtained from the provided drawings without any creative effort.

Figure 1:
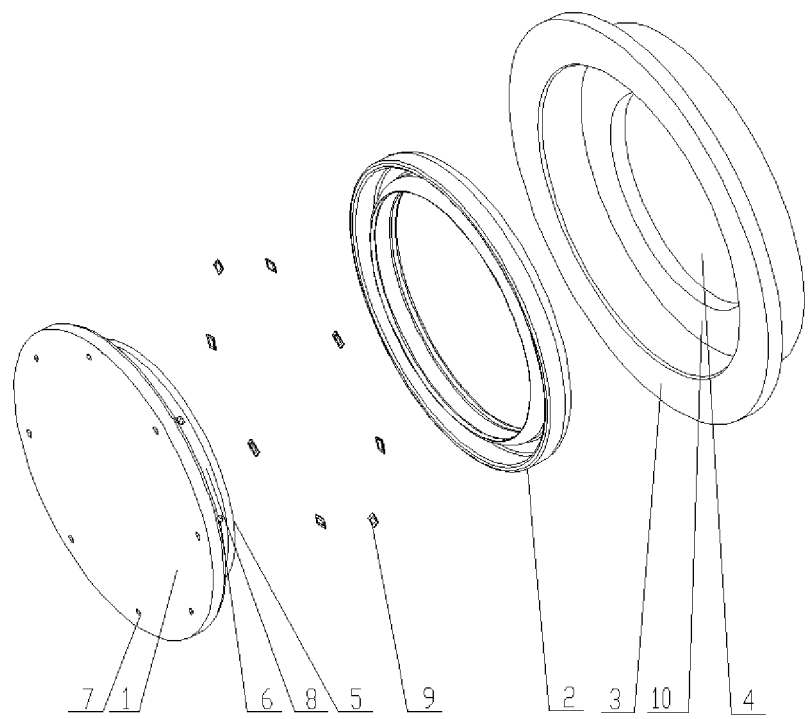
FIG. 1 is an explosive structural diagram of an electronic device housing in one embodiment of the present disclosure.
Figure 2:
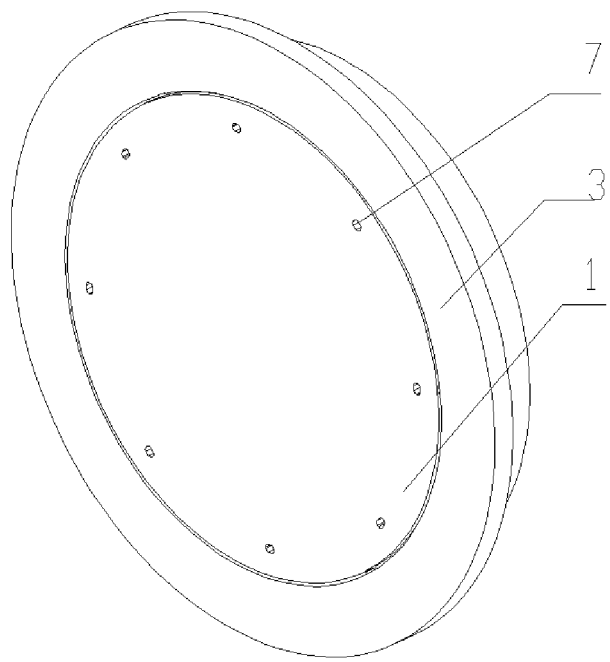
FIG. 2 is a perspective structural diagram of the electronic device housing in one embodiment of the present disclosure.

In the drawings: 1. front casing; 2. seal; 2-1. sealing part; 2-2. fixing part; 3. rear casing; 4. opening; 5. flange; 6. first through hole; 7. second through hole; 8. arc-shaped protrusion; 9. filter screen; 10. step.

DETAILED DESCRIPTION

In order to make the purpose, technical solution, and advantages of the present disclosure clearer, technical solutions of embodiments of the present disclosure will be clearly and completely described below with reference to the embodiments and the drawings s of the present disclosure. Obviously, the described embodiments are only a part of the embodiments of the present disclosure, rather than all the embodiments. Based on the embodiments in the present disclosure, all other embodiments obtained by those of ordinary skill in the art without creative efforts shall fall within the protection scope of the present disclosure.

The technical solutions provided by each embodiment of the present disclosure will be described in combination with the accompanying drawings in detail in the following.

An embodiment of the present invention discloses an electronic device housing, and as shown in FIGS. 1 to 4, the electronic device housing includes a housing and a seal 2. The interior of the casing is provided with an accommodating cavity for accommodating electronic device components, for example, the casing may be the housing of wearable devices such as smartwatches, smart wristbands, smart rings, Virtual Reality (VR) headsets, or the housing of other electronic devices with waterproof requirements such as locators, walkie talkies, mobile phones, tablets, etc. The casing wall of the casing is provided with a mounting cavity for mounting the seal 2.

The casing is provided with a first through hole 6 and a second through hole 7, the first through hole 6 communicates the mounting cavity with the accommodating cavity, and the second through hole 7 communicates the mounting cavity with the outside. Here, the number of the first through holes 6 and the second through holes 7 may be set according to requirement. When a plurality of first through holes 6 and second through holes 7 are provided, the first through holes and the second through holes are preferred to be arranged at equal intervals. In addition, the first through hole 6 and the second through hole 7 may be straight holes or oblique holes, and the radial cross-sectional shape of the holes may also be set according to requirement, for example, the holes may be circular, square, diamond, triangular, elliptical, rectangular, etc.

Figure 5:
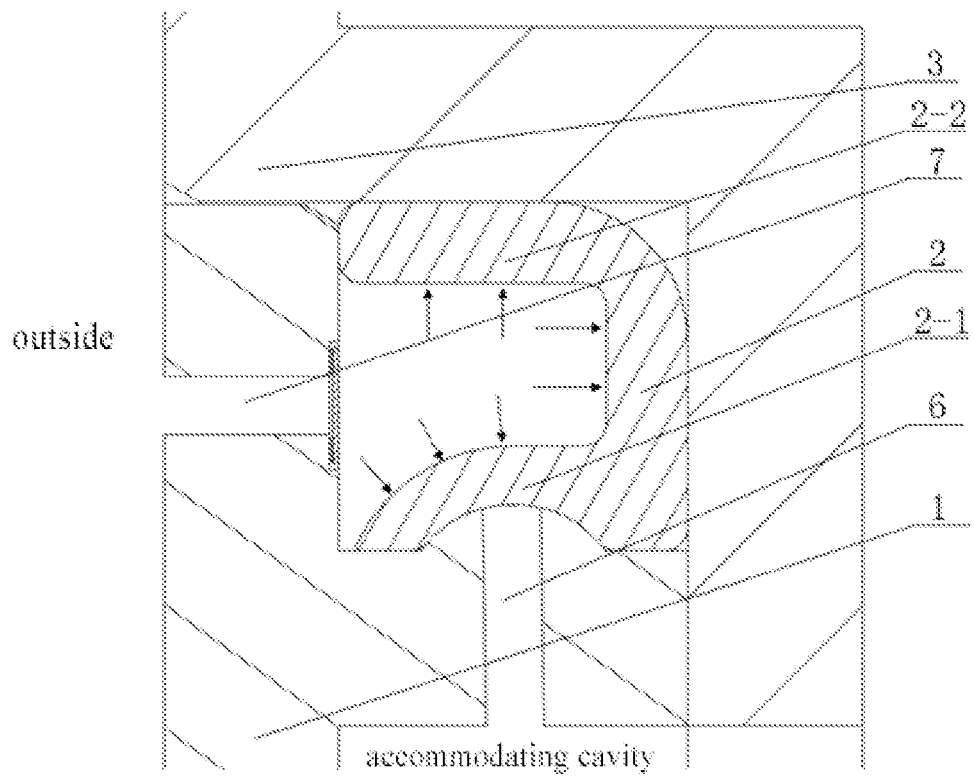
FIG. 5 is an operation principle diagram when the electronic device housing achieves waterproof function in an embodiment of the present disclosure.

The seal 2 comprises a sealing part 2-1 and a fixing part 2-2 connected to the sealing part 2-1, wherein the fixing part 2-2 is fixed to the casing wall, the sealing part 2-1 blocks the first through hole 6, and the fixing part 2-2 is used for supporting and fixing the sealing part 2-1. The sealing part 2-1 has elasticity and may be deformed accordingly when it is subjected to external forces. When liquid is sprayed onto the casing or the casing is immersed in the liquid, the liquid flows into the mounting cavity through the second through hole 7, as shown in FIG. 5. Since the density of liquid is greater than that of air, the pressure generated by the liquid is greater, and the liquid may press the seal 2, causing the sealing part 2-1 to more tightly block the first through hole 6. As a result, the liquid can only remain in the mounting cavity and cannot enter the accommodating cavity through the first through hole 6, so that the waterproof function of the casing is achieved. When the liquid on the casing is wiped dry or the casing is taken out from the liquid, the liquid in the mounting cavity may flow out through the second through hole 7.

Figure 6:
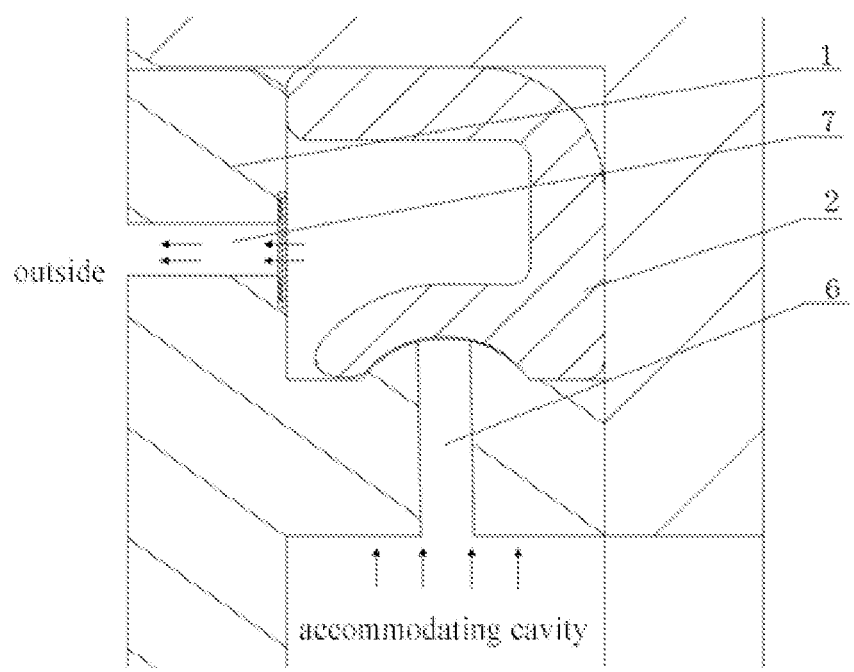
FIG. 6 is an operation principle diagram when the electronic device housing achieves balanced internal pressure and external pressure in an embodiment of the present disclosure.

Under normal conditions, the pressure inside the accommodating cavity of the casing is the same as the external pressure, and when the external pressure changes, an imbalance is generated between the housing cavity and the external pressure, for example from a high pressure region to a low pressure region, or from a low pressure region to a high pressure region. When the pressure inside the accommodating cavity of the casing is greater than the external pressure, as shown in FIG. 6, at least part of the sealing part 2-1 is pushed to open and separated from the first through hole 6 due to the pressure difference, causing the accommodating cavity to communicate with the mounting cavity and thus communicating the accommodating cavity with the outside. Therefore, the gas inside the accommodating cavity can flow to the outside through the first through hole 6, the mounting cavity, and the second through hole 7 in sequence, thereby reducing the pressure inside the accommodating cavity, achieving pressure balance between the inside and outside of the casing, and protecting the electronic device components inside the accommodating cavity. When the pressure inside the accommodating cavity of the casing is less than the external pressure, the external gas slowly diffuses into the accommodating cavity of the casing through the second through hole 7, the mounting cavity, and first through hole 6 in sequence, achieving pressure balance between the inside and outside of the casing.

In summary, in the electronic device housing of the present embodiment, a mounting cavity for mounting the seal is provided on the casing wall of the casing, and a first through hole and a second through hole are provided on the casing, so that the accommodating cavity inside the casing communicates with the mounting cavity through the first through hole, and the mounting cavity inside the casing communicates with the outside through the second through hole, and the sealing part of the seal blocks the first through hole, thereby effectively preventing external liquid from entering the accommodating cavity. Moreover, when the air pressure is different between the accommodating cavity and the outside, gas exchange between the accommodating cavity and the outside is achieved through the first through hole and the second through hole, thereby achieving air pressure balance.

Figure 4:
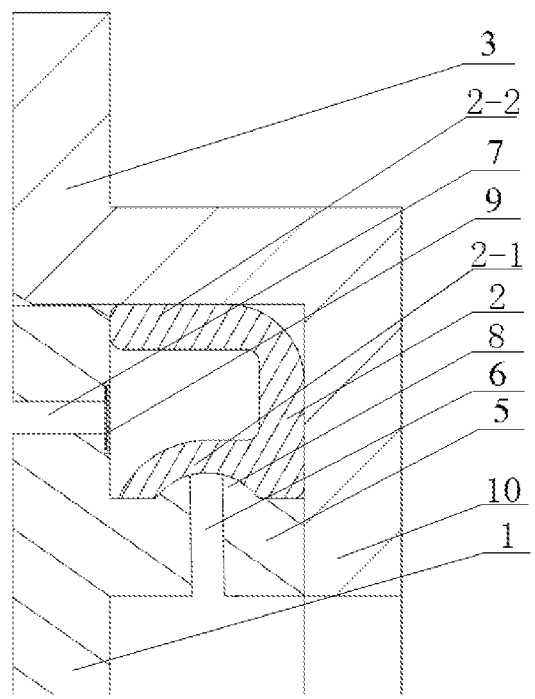
FIG. 4 is a partially enlarged axial cross-sectional diagram of an electronic device housing in one embodiment of the present disclosure.

In one embodiment, as shown in FIG. 4, the surface of the sealing part 2-1 facing the first through hole 6 has an arc-shaped portion that is concave towards a direction away from the first through hole 6, so that the sealing part 2-1 abuts more tightly against the casing at the first through-hole 6, thereby preventing liquid in the mounting cavity from passing through the first through hole 6, and improving the waterproof performance of the casing.

Furthermore, as shown in FIG. 4, the casing is provided with an arc-shaped protrusion 8 that corresponds to the shape of the arc-shaped portion, and the first through hole 6 is provided on the arc-shaped protrusion 8, so that the casing around the first through-hole 6 abuts tightly against the sealing part 2-1. Therefore, it is difficult for the liquid flowing into the mounting cavity through the second through hole 7 to flow into the first through hole 6, further enhancing the waterproof performance of the casing.

Figure 3:
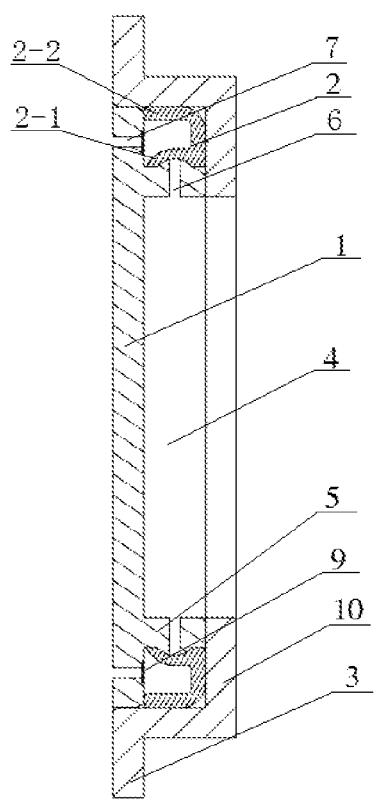
FIG. 3 is an axial cross-sectional diagram of the electronic device housing in one embodiment of the present disclosure.

In one embodiment, as shown in FIGS. 3 to 4, the fixing part 2-2 abuts at least partially against two inner walls of the mounting cavity that are not located on the same plane, so that the fixing part 2-2 is more firmly fixed to support the rotation of the sealing part 2-1.

In a specific embodiment, the seal 2 is made of hydrophobic material or coated with a hydrophobic layer on the surface thereof, which can prevent the liquid from entering the accommodating cavity of the casing due to capillary effect.

In a specific embodiment, as shown in FIGS. 1 to 4, the casing includes a front casing 1 and a rear casing 3.

The rear casing 3 is provided with an opening 4, and the front casing 1 is mounted at the opening 4 of the rear casing 3 through a seal 2; a flange 5 is provided on the circumferential edge of the inner side surface of front casing 1, and a mounting cavity is formed between the circumferential edge of front casing 1, the flange 5, and the inner wall of the rear casing 3; an arc-shaped protrusion 8 is provided on the flange 5, the first through holes 6 are provided on the arc-shaped protrusion 8, and the second through holes 7 are provided on the circumferential edge of the front casing 1. Specifically, the second through holes 7 are located on the side of the flange 5 away from the center of the front casing 1. Here, the front casing 1 may also be made of hydrophobic materials or coated with a hydrophobic layer on the surface, thereby preventing the liquid from entering the accommodating cavity of the casing due to capillary effect.

In one embodiment, as shown in FIGS. 3 to 4, the fixing part 2-2 of the seal 2 seals a connection between the front casing 1 and the rear casing 3, thereby achieving waterproof sealing to the gap between the front casing 1 and the rear casing 3.

In one embodiment, in order to prevent external liquid from entering the interior of the accommodating cavity, a compression force is imposed between the sealing part 2-1 and the flange 5 and between the fixing part 2-2 and the inner wall of the rear casing 3 when the seal 2 is assembled between the rear casing 3 and the front casing 1, so that the liquid cannot enter the accommodating cavity through the gaps between the seal 2 and the flange 5 as well as the inner wall of the rear casing 3.

In one embodiment, as shown in FIGS. 1, 3, and 4, the electronic device housing further comprises a filter screen 9.

The filter screen 9 is disposed at the second through hole 7 on the inner surface of the front casing 1. When a plurality of second through holes 7 are provided, the filter screen 9 may be integrated or divided into a plurality of parts, and the filter screen 9 may be fixed to the front casing 1 via adhesive. The provision of filter screen 9 can effectively prevent dust particles from entering the interior of the casing, and achieve the dust-proof function of the casing.

In one or some embodiments, the filter screen 9 is a metal mesh, a polymer film, or a combination thereof. The combination of thereof may be a layered stacked combination of metal mesh and polymer film. In order to enhance the waterproof function of the casing, a hydrophobic layer may be coated on the surface of filter screen 9.

In one or some embodiments, the material of the rear casing 3 is metal, engineering plastic, ceramic or glass, and the material of the front casing 1 is also metal, engineering plastic, ceramic or glass. The material of rear casing 3 may be the same or different from that of the front casing 1. Certainly, the rear casing 3 and front casing 1 may also be other materials that achieve support and protection functions, which are also within the protection scope of the present disclosure.

In one embodiment, the material of seal 2 is a polymer organic compound with compressive property and rebound property, for example, the material of seal 2 is rubber.

In one embodiment, as shown in FIGS. 1, 3, and 4, a step 10 is provided at the opening 4 of the rear casing 3, and the depth of the step 10 is consistent with the thickness of the front casing 1. When the front casing 1 and the rear casing 3 are assembled together, the flange 5 abuts against the step 10 to perform the position limitation of the front casing 1, so that the front casing 1 and the rear casing 3 are on the same plane. At the same time, the bottom of seal ring 2 also abuts against the step 10, which can prevent the position of the seal ring 2 from shifting between front casing 1 and rear casing 3.

Finally, one embodiment of the present disclosure also discloses an electronic device, the electronic device has the electronic device housing as described above in any of the aforementioned embodiments and components accommodated inside the casing. The electronic device has an excellent waterproof function and a function of balancing the internal and external air pressure of the device, which can be used in extreme conditions.

The above is only a specific embodiment of the present disclosure. Under the above teachings of the present disclosure, those skilled in the art can make other improvements or variations based on the above embodiments. Those skilled in the art should understand that the above specific description is only to better explain the purpose of the present disclosure, and the protection scope of the present disclosure should be based on the claimed protection scope.

What is claimed is:

1. An electronic device housing, comprising a casing and a seal, wherein the casing has an interior provided with an accommodating cavity configured to accommodate electronic device components, and a casing wall provided with a mounting cavity configured to mount the seal;
   wherein the casing is provided with a first through hole and a second through hole, wherein the first through hole communicates the mounting cavity with the accommodating cavity, and the second through hole communicates the mounting cavity with an outside; and
   wherein the seal comprises a sealing part and a fixing part connected with the sealing part, wherein the fixing part is fixed to the casing wall, and the sealing part blocks the first through hole, and wherein the sealing part has elasticity, and when pressure in the accommodating cavity is greater than that of the outside, at least part of the sealing part is separated from the first through hole, such that the accommodating cavity communicates with the mounting cavity to communicate with the outside.

2. The electronic device housing of claim 1, wherein a surface of the sealing part facing the first through hole has an arc-shaped portion that is concave towards a direction away from the first through hole.

3. The electronic device housing of claim 2, wherein the casing is provided with an arc-shaped protrusion that corresponds to a shape of the arc-shaped portion, and the first through hole is provided on the arc-shaped protrusion.

4. The electronic device housing of claim 1, wherein the fixing part abuts at least partially against two inner walls of the mounting cavity that are not located on the same plane.

5. The electronic device housing of claim 1, wherein the seal is made of hydrophobic material or coated with a hydrophobic layer on a surface thereof.

6. The electronic device housing of claim 1, wherein the casing comprises a front casing and a rear casing; and
wherein the rear casing is provided with an opening, and the front casing is mounted on the opening, with the seal interposed between the front casing and the rear casing.

7. The electronic device housing of claim 6, wherein the fixing part of the seal is configured to seal a connection between the front casing and the rear casing.

8. The electronic device housing of claim 6, wherein a flange is provided on a circumferential edge of an inner surface of the front casing, and the mounting cavity is formed between the circumferential edge of the front casing, the flange, and an inner wall of the rear casing; and wherein the first through hole is provided on the flange, and the second through hole is provided on a circumferential edge of the front casing.

9. The electronic device housing of claim 8, wherein a compression force is imposed between the sealing part and the flange and between the fixing part and the inner wall of the rear casing when the seal is mounted between the rear casing and the front casing.

10. An electronic device, wherein the electronic device has the electronic device housing of claim 1 and components accommodated inside the casing.

* * * * *